(12) United States Patent
Oh

(10) Patent No.: US 8,779,803 B2
(45) Date of Patent: Jul. 15, 2014

(54) DATA OUTPUT DRIVER AND INTEGRATED CIRCUIT INCLUDING THE SAME

(75) Inventor: Seung Min Oh, Icheon-si (KR)

(73) Assignee: SK Hynix Inc., Gyeonggi-do (KR)

(*) Notice: Subject to any disclaimer, the term of this patent is extended or adjusted under 35 U.S.C. 154(b) by 282 days.

(21) Appl. No.: 13/280,665

(22) Filed: Oct. 25, 2011

(65) Prior Publication Data

US 2012/0098576 A1   Apr. 26, 2012

(30) Foreign Application Priority Data

Oct. 26, 2010 (KR) .................. 10-2010-0104861

(51) Int. Cl.
H03K 3/00 (2006.01)

(52) U.S. Cl.
CPC ........................................ *H03K 3/00* (2013.01)
USPC .......................................................... 327/108

(58) Field of Classification Search
None
See application file for complete search history.

(56) References Cited

U.S. PATENT DOCUMENTS

| | | | |
|---|---|---|---|
| 4,678,941 A * | 7/1987 | Chao et al. ..................... | 326/107 |
| 5,149,990 A * | 9/1992 | Yamazaki et al. .............. | 326/21 |
| 5,864,506 A * | 1/1999 | Arcoleo et al. ........... | 365/189.05 |
| 6,127,878 A * | 10/2000 | Hanson et al. ................. | 327/374 |
| 6,643,208 B2 * | 11/2003 | Yamagata et al. ............ | 365/226 |
| 6,667,648 B2 * | 12/2003 | Stout et al. ..................... | 327/333 |
| 6,720,673 B2 * | 4/2004 | Blanco et al. ................... | 307/64 |
| 6,731,154 B2 * | 5/2004 | Bednar et al. ................. | 327/383 |
| 7,262,643 B2 * | 8/2007 | Hayashi et al. ................ | 327/108 |
| 7,329,968 B2 * | 2/2008 | Shepard et al. ................. | 307/18 |
| 7,355,901 B2 * | 4/2008 | Kim et al. ................ | 365/189.05 |
| 7,443,212 B2 * | 10/2008 | Hayashi et al. ............... | 327/108 |
| 7,482,833 B2 * | 1/2009 | Sreeramaneni ................. | 326/30 |
| 7,642,836 B2 * | 1/2010 | Caplan et al. ................. | 327/534 |
| 7,705,636 B2 * | 4/2010 | Kim et al. ..................... | 327/108 |
| 7,755,385 B2 * | 7/2010 | Sreeramaneni ................. | 326/30 |
| 8,015,426 B2 * | 9/2011 | VanStee et al. ............... | 713/324 |
| 8,120,391 B2 * | 2/2012 | Bayerer et al. ................ | 327/108 |
| 2003/0102904 A1 * | 6/2003 | Mizuno et al. ................ | 327/544 |

FOREIGN PATENT DOCUMENTS

KR   1020090022059 A   3/2009
KR   1020100021119 A   2/2010

* cited by examiner

*Primary Examiner* — Lincoln Donovan
*Assistant Examiner* — Khareem E Almo
(74) *Attorney, Agent, or Firm* — William Park & Associates Patent Ltd.

(57) ABSTRACT

A data output driver includes a pull-up output pre-driver configured to output a plurality of pull-up signals, wherein whether each of the plurality of pull-up signals is enabled is determined in accordance with a driver mode signal, a pull-down output pre-driver configured to output a plurality of pull-down signals, wherein whether each of the plurality of pull-down signals is enabled is determined in accordance with the driver mode signal, and an output driver circuit configured to output data, wherein a driver strength of the output driver circuit is determined in accordance with the pull-up signals and pull-down signals.

18 Claims, 8 Drawing Sheets

3.3V 1.8V

US 8,779,803 B2

DATA OUTPUT DRIVER AND INTEGRATED CIRCUIT INCLUDING THE SAME

CROSS-REFERENCE TO RELATED APPLICATION

Priority is claimed to Korean patent application number 10-2010-0104861 filed on Oct. 26, 2010, the entire disclosure of which is incorporated herein by reference in its entirety.

BACKGROUND

Exemplary embodiments of the present invention relate generally to an integrated circuit and more particularly to a data output driver and an integrated circuit including the same.

Ongoing trends for the integrated circuit (IC) include a high degree of integration, low power consumption, and a fast operating speed. In addition, the data output circuit of the integrated circuit (IC) requires data reliability.

FIG. 1A shows a memory device including a data output driver circuit.

Referring to FIG. 1A, the memory device 100 includes an output pre-driver 120 coupled to a memory chip 110, including memory cells for storing data, and an output driver 130.

The memory chip 110 includes circuits for storing data in the memory cells and reading stored data from the memory cells. Data Dout outputted from the memory chip 110 is pulled up (PU) or pulled down (PD) by the output pre-driver 120 and then transferred to the output driver 130.

The output driver 130 outputs the pull-up signal PU and the pull-down signal PD of the output pre-driver 120 to a data line DQ.

FIG. 1B shows the output pre-driver 120 and the output driver 130 of FIG. 1A.

Referring to FIG. 1B, the output pre-driver 120 includes first and second PMOS transistors P1 and P2 and first and second NMOS transistors N1 and N2. Furthermore, the output driver 130 includes a third PMOS transistor P3 and a third NMOS transistor N3.

The first PMOS transistor P1 and the first NMOS transistor N1 correspond to a pull-up unit for pulling up the data Dout, received from the memory chip 110, to a power supply voltage level when the data Dout is in a logic low and outputs the pulled-up data as the pull-up signal PU. The second PMOS transistor P2 and the second NMOS transistor N2 correspond to a pull-down unit for pulling down the data Dout, received from the memory chip 110, to a ground voltage level when the data Dout is in a logic high and outputs the pulled-up data as the pull-up signal PU. The output driver 130 outputs data of the power supply voltage level in response to the pull-up signal PU of the ground voltage level and outputs data of the ground voltage level in response to the pull-down signal PD of the power supply voltage level.

The output pre-driver 120 and the output driver 130 pull up the voltage level of data to the power supply voltage level or pull down the voltage level of data to the ground voltage level. If a power supply voltage of 3.3 V is supplied to the output driver 130, the voltage level of the data pulled up at the output driver 130 becomes 3.3 V.

If a plurality of memory chips 110 is included in the memory device 100, each memory chip 110 is operated by the same power supply voltage, and thus the output pre-driver 120 and the output driver 130 of each memory chip 110 is operated by the same power supply voltage.

FIG. 2 shows data outputted from a plurality of memory chips (e.g., memory chips of a multi-chip package) and operating voltages of the memory chips.

As shown in FIG. 2, in an ideal case, a tilt that a voltage level of data shifts from a low level to a high level or from a high level to a low level is 90 degrees irrespective of an operating voltage or the number of memory chips. The tilt, in other word, a slew rate may vary according to the number of memory chips which are allocated to the output driver. In addition, a strength of the output driver 130 may vary according to an operating voltage and the number of memory chips which are allocated to the output driver.

Therefore, data outputted through the output pre-driver 120 and the output driver 130 of FIG. 1A may have a low reliability.

BRIEF SUMMARY

Exemplary embodiments of the present invention relate to a data output driver which can be simultaneously used in memory chips using different operating voltages from each other and which can be used irrespective of a power supply voltage and an output driver operation mode, and an IC including the data output driver circuit.

A data output driver according to an aspect of the present disclosure includes a pull-up output pre-driver configured to output at least one pull-up signal by pulling up data to be pulled up in response to a driving voltage and a driver mode signal, a pull-down output pre-driver configured to output at least one pull-down signal by pulling down data to be pulled down in response to the driving voltage and the driver mode signal, and an output driver circuit configured to have a varying driver ability to output pull-up data or pull-down data in response to the at least one pull-up signal and the at least one pull-down signal.

An integrated circuit according to an aspect of the present disclosure includes an internal circuit configured to perform an operation for transmitting and receiving data to and from an external device; a pull-up output pre-driver configured to output at least one pull-up signal by pulling up data to be pulled up in response to a driving voltage and a driver mode signal, from among data outputted from the internal circuit; a pull-down output pre-driver configured to output least one pull-down signal by pulling down data to be pulled down in response to the driving voltage and the driver mode signal, from among data outputted from the internal circuit; and an output driver circuit configured to have a varying driver ability to output pull-up data or pull-down data to the external device in response to the at least one pull-up signal and the at least one pull-down signal.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1A:
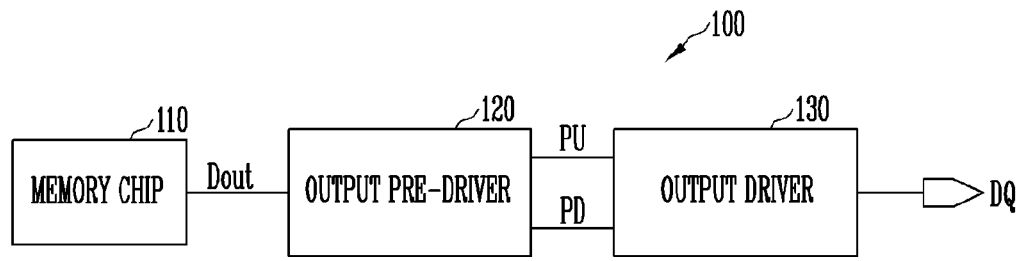
FIG. 1A shows a memory device including a data output driver circuit.
Figure 1B:
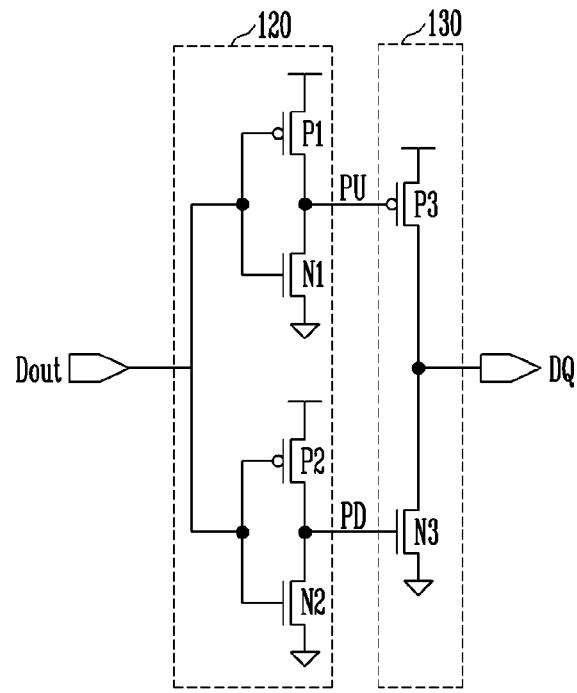
FIG. 1B shows an output pre-driver and an output driver of FIG. 1A.
Figure 2:
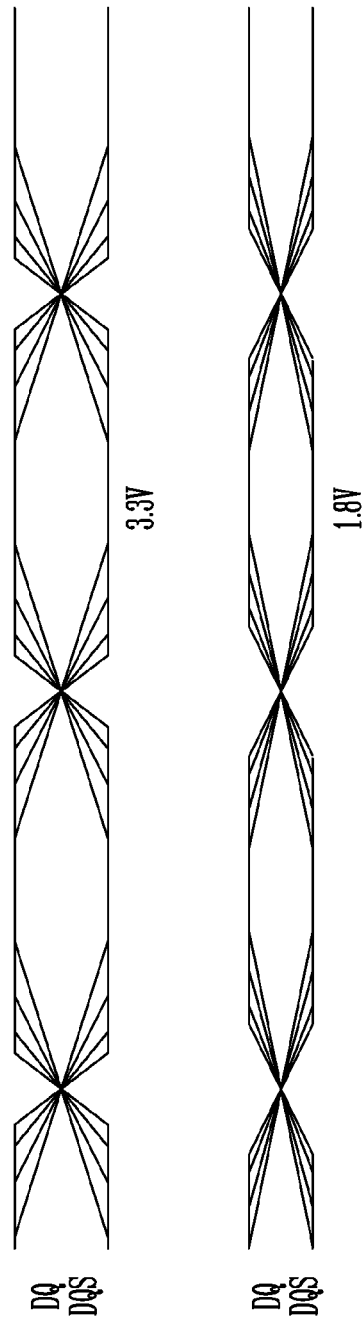
FIG. 2 shows data outputted from a plurality of memory chips (e.g., memory chips of a multi-chip package) and operating voltages of the memory chips.
Figure 3:
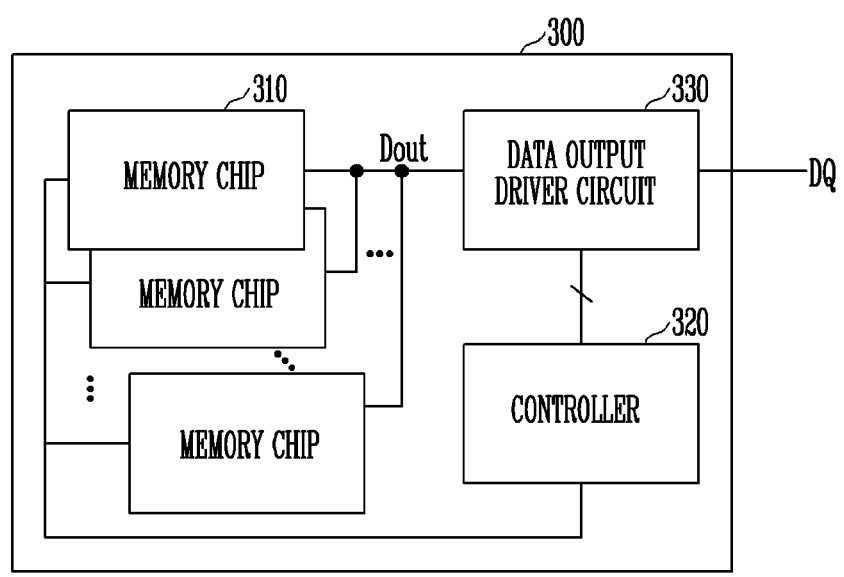
FIG. 3 shows an IC for illustrating this disclosure.

FIG. 3 shows an IC according to an embodiment of the present invention.

Referring to FIG. 3, the IC 300 includes a plurality of memory chips 310, a controller 320, and a data output driver circuit 330.

Each of the memory chips 310 may include circuits for storing data. In addition, the memory chips 310 may have the same driving voltage or different driving voltages from each other. For example, data output voltage of the memory chips 310 may have the same driving voltage or different driving voltages from each other. The driving voltage, according to an example, is 3.3 V or 1.8 V.

The controller 320 controls the operation of the memory chip 310 and the data output driver circuit 330.

The data output driver circuit 330 outputs data Dout, received from the memory chip 310, to a data line DQ coupled to the external device in response to a control signal of the controller 320.

The data output driver circuit 330 may transfer output data to the data line DQ and may be operated according to the driving voltage of the memory chip 320 and an driver mode as to how many memory chips output data at the same time.

Figure 4A:
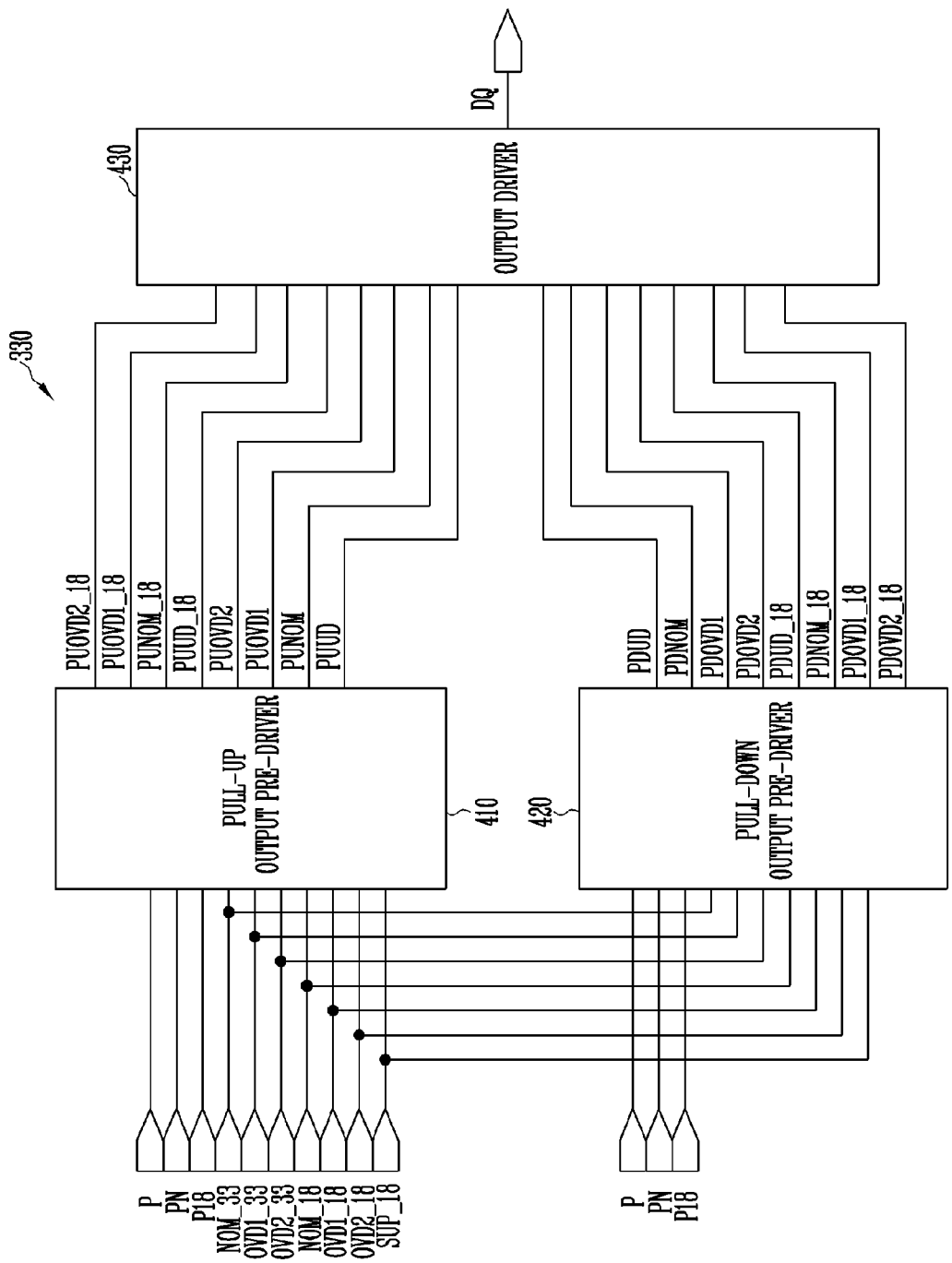
FIG. 4A shows a data output driver circuit of FIG. 3.

FIG. 4A shows the data output driver circuit 330 of FIG. 3.

Referring to FIG. 4A, the data output driver circuit 330 includes a pull-up output pre-driver 410, a pull-down output pre-driver 420, and an output driver 430.

The pull-up output pre-driver 410 is configured to output pull-up signals to control the output driver 430, and the pull-down output pre-driver 420 is configured to output pull-down signals to control the output driver 430. According to an example, data output voltage, e.g., logic power voltage of output stage (VCCQ) of the memory chips coupled to the pull-up output pre-driver 410 and the pull-down output pre-driver 420 is 3.3 V or 1.8 V.

In addition, the data output driver circuit 330 according to an embodiment of the present invention has a plurality of driver modes such as an under mode, a nominal mode NOM, a first over-driver mode OVD1, and a second over-driver mode OVD2 according to the number of memory chips 310.

Accordingly, data signal inputted to the pull-up output pre-driver 410 and the pull-down output pre-driver 420 may vary in the driver mode and the output voltage of the memory chip.

Data signals P, PN and P18 inputted to the pull-up and the pull-down output pre-drivers 410 and 420 are data signals received from the memory chip 310. Each of the data signal P and the data signal PN is a 3.3 V data signal and an opposite data signal from each other, and P18 is a 1.8 V data signal.

Furthermore, a signal SUP_18 indicating the under mode, signals NOM_33 and NOM_18 indicating the nominal mode, signals OVD1_33 and OVD1_18 indicating the first over-driver mode, and signals OVD2_33 and OVD2_18 indicating the second over-driver mode are inputted to the pull-up output pre-driver 410 and the pull-down output pre-driver 420. A number in the name of the signal indicates a driving voltage, e.g., a data output voltage.

For example, the signal NOM_18 indicates the nominal mode when driving voltage is 1.8 V.

When each of the memory chips 310 outputs a data signal according to the driver modes, the pull-up output pre-driver 410 and the pull-down output pre-driver 412 output pull-up signals and pull down signals, respectively, according to a driving voltage and a driver mode.

Table 1 below shows signals applied according to the driver modes.

TABLE 1

|  | driving Voltage | SUP 18 | NMO_33 | NOM_18 | OVD1_33 | OVD1_18 | OVD2_33 | OVD2_18 |
|---|---|---|---|---|---|---|---|---|
| Under Mode | 3.3 | 0 | 0 | 0 | 0 | 0 | 0 | 0 |
|  | 1.3 | 1 | 0 | 0 | 0 | 0 | 0 | 0 |
| Nominal Mode | 3.3 | 0 | 1 | 0 | 0 | 0 | 0 | 0 |
|  | 1.3 | 1 | 0 | 1 | 0 | 0 | 0 | 0 |
| First over-driver mode | 3.3 | 0 | 1 | 0 | 1 | 0 | 0 | 0 |
|  | 1.3 | 1 | 0 | 1 | 0 | 1 | 0 | 0 |
| Second over-driver mode | 3.3 | 0 | 1 | 0 | 1 | 0 | 1 | 0 |
|  | 1.3 | 1 | 0 | 1 | 0 | 1 | 0 | 1 |

In Table 1, when a signal indicated by '1' is applied with a high level and a signal indicated by '0' is applied with a low level, a driver mode is determined. Signals to output the driver mode are applied to the controller 320.

The controller 320 determines a driver mode according to the number of memory chips 310 which are operated and inputs signals for selecting the driver mode as in Table 1 to the data output driver circuit 330.

The pull-up output pre-driver 410 outputs first to eighth pull-up signals PUUD, PUNOM, PUOVD1, PUOVD2, PUUD_18, PUNOM_18, PUOVD1_18, and PUOVD2_18. Signals without '18' from among the pull-up signals may be pull-up signals when the driving voltage is 3.3 V.

Likewise, the pull-down output pre-driver 420 outputs pull-down signals PDUD, PDNOM, PDOVD1, PDOVD2, PDUD_18, PDNOM_18, PDOVD1_18, and PDOVD2_18.

The driver strength of the output driver 430 is controlled by the pull-up signals and the pull-down signals outputted from the pull-up and pull-down output pre-drivers 410 and 420, so that data signals are outputted to the data line DQ. That is, when the output driver 430 outputs the data signals to the data line DQ, the driver strength may be controlled in response to the pull-up signal and the pull-down signal.

Figure 4B:
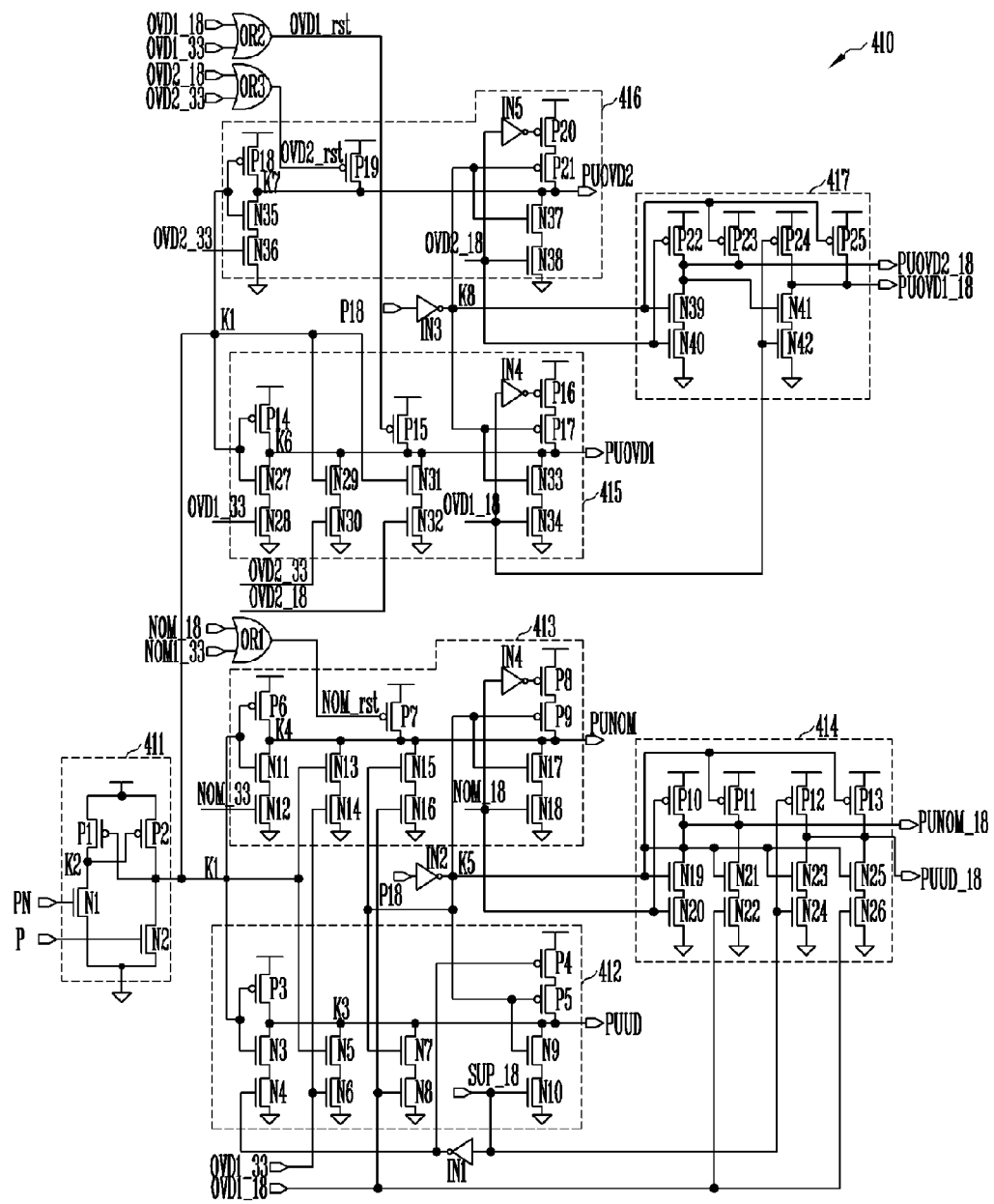
FIG. 4B shows a pull-up output pre-driver of FIG. 4A.

FIG. 4B shows the pull-up output pre-driver 410 of FIG. 4A.

Referring to FIG. 4B, the pull-up output pre-driver 410 includes a data input circuit 411 and first to sixth pull-up circuits 412 to 417. Furthermore, the pull-up output pre-driver 410 further includes circuits for resetting the respective pull-up circuits.

The data input circuit 411 receives the data signals P and PN when the driving voltage is 3.3 V, and the first pull-up circuit 412 is driven in the under mode operated by default.

The second pull-up circuit 413, together with the first pull-up circuit 412, is driven in the nominal mode, and the third pull-up circuit 414, together with the first pull-up circuit 413, is driven in the under mode or the nominal mode in the 1.8 V operating mode.

The fourth pull-up circuit 415, together with the first to third pull-up circuits 412 to 414, is driven in the first over-driver mode, and the fifth pull-up circuit 416, together with the first to fourth pull-up circuits 412 to 415, is driven in the second over-driver mode.

Furthermore, the sixth pull-up circuit 417, together with the first to fifth pull-up circuits 412 to 416, is driven in the first or the second over-driver mode when the driving voltage is 1.8 V.

A connection relationship between the circuits of the pull-up output pre-driver 410 is described in detail below.

The data input circuit 411, according to an example, includes first and second PMOS transistors P1 and P2 and first and second NMOS transistors N1 and N2.

The first PMOS transistor P1 and the first NMOS transistor N1 are coupled in series between a power supply voltage VCC and a ground node. The second PMOS transistor P2 and the second NMOS transistor N2 are coupled between the power supply voltage VCC and the ground node. According to an example, the power supply voltage VCC is 3.3 V in the 3.3 V operating mode and 1.8 V in the 1.8 V operating mode.

The gate of the first PMOS transistor P1 is coupled to a node K1, and the gate of the second PMOS transistor P2 is coupled to a node K2.

Furthermore, the data signal PN is inputted to the first NMOS transistor N1, and the data signal P is inputted to the second NMOS transistor N2. The data signal PN may be a complementary signal of the data signal P.

Furthermore, the data input circuit 411 is formed of a differential amplification circuit. Thus, when the data signal P is in a high level, the node K1 is coupled to the ground node. When the data signal PN is in a high level, the power supply voltage VCC is supplied to the node K1.

The first pull-up circuit 412, according to an example, includes third to fifth PMOS transistors P3 to P5 and third to $10^{th}$ NMOS transistors N3 to N10.

The third PMOS transistor P3 and the third and the fourth NMOS transistors N3 and N4 are coupled in series between the power supply voltage VCC and the ground node.

The gates of the third PMOS transistor P3 and the third NMOS transistor N3 are coupled in common to the node K1, and the output of a first inverter IN1 is inputted to the gate of the fourth NMOS transistor N4. The first inverter IN1 inverts the signal SUP_18, indicating the under mode when the driving voltage is 1.8 V.

A node where the third PMOS transistor P3 and the third NMOS transistor N3 are connected is a node K3.

The fifth and the sixth NMOS transistors N5 and N6 are coupled in series between the node K3 and the ground node, and the gate of the fifth NMOS transistor N5 is coupled to the node K1.

Furthermore, the signal OVD1_33, indicating the first over-driver mode when the driving voltage is 3.3 V, is inputted to the gate of the sixth NMOS transistor N6.

The seventh and the eighth NMOS transistors N7 and N8 are coupled between the node K3 and the ground node.

The output of the second inverter IN2 is inputted to the gate of the seventh NMOS transistor N7. An output terminal of the second inverter IN2 is coupled to a node K5. The data signal P18 is inputted to the second inverter IN2.

Furthermore, the signal OVD1_18, indicating the first over-driver mode when the driving voltage is 1.8 V, is inputted to the gate of the eighth NMOS transistor N8.

The ninth and the tenth NMOS transistors N9 and N10 are coupled between the node K3 and the ground node.

The gate of the ninth NMOS transistor N9 is coupled to the node K5. The signal SUP_18, indicating the under mode when the driving voltage is 1.8 V, is inputted to the gate of the tenth NMOS transistor N10.

The fourth and the fifth PMOS transistors P4 and P5 are coupled in series between the power supply voltage VCC and the node K3.

The output signal of the first inverter IN1 is inputted to the gate of the fourth PMOS transistor P4. The gate of the fifth PMOS transistor P5 is coupled to the node K5.

Furthermore, a first pull-up signal PUUD is outputted from the node K3.

The second pull-up circuit 413 includes sixth to ninth PMOS transistors P6 to P9 and $11^{th}$ to $18^{th}$ NMOS transistors N11 and N18.

The sixth PMOS transistors P6 and the $11^{th}$ and the $12^{th}$ NMOS transistors N11 and N12 are coupled in series between the power supply voltage VCC and the ground node.

The gates of the sixth PMOS transistor P6 and the $11^{th}$ NMOS transistor N11 are coupled in common to the node K1. A node where the sixth PMOS transistor P6 and the $11^{th}$ NMOS transistor N11 are connected is coupled to a node K4. Furthermore, the signal NOM_33, indicating the nominal mode when the driving voltage is 3.3 V is inputted the gate of the $12^{th}$ NMOS transistor N12.

The $13^{th}$ and the $14^{th}$ NMOS transistors N13 and N14 are coupled in series between the node K4 and the ground node.

The gate of the $13^{th}$ NMOS transistor N13 is coupled to the node K1, and the signal OVD1_33 is inputted to the gate of the $14^{th}$ NMOS transistor N14.

The $15^{th}$ and the $16^{th}$ NMOS transistors N15 and N16 are also coupled in series between the node K4 and the ground node.

The gate of the $15^{th}$ NMOS transistor N15 is coupled to the node K5, and the signal OVD1_18 is inputted to the gate of the $16^{th}$ NMOS transistor N16.

Furthermore, the $17^{th}$ and the $18^{th}$ NMOS transistors N17 and N18 are also coupled in series between the node K4 and the ground node.

The gate of the $17^{th}$ NMOS transistor N17 is coupled to the node K5. The signal NOM_18, indicating the nominal mode when the driving voltage is 1.8 V, is inputted to the gate of the $18^{th}$ NMOS transistor N18.

A second pull-up signal PUNOM is outputted from the node K4.

The seventh PMOS transistor P7 is coupled between the power supply voltage VCC and the node K4. A nominal mode reset signal NOM_rst is inputted to the gate of the seventh PMOS transistor P7.

The nominal mode reset signal NOM_rst is the output of a first OR gate OR1. The first OR gate OR1 performs an OR operation on the signal NOM_18 and the signal NOM_33. Therefore, the nominal mode reset signal NOR_rst becomes a low level when both the signal NOM_18 and the signal NOM_33 are in a low level.

When the nominal mode reset signal NOM_rst is in a high level, the seventh PMOS transistor P7 is turned off, so that the nominal mode output circuit 413 outputs the second pull-up signal PUNOM according to the data signals P and PN.

When both the signal NOM_18 and the signal NOM_33 are in a low level, the nominal mode reset signal NOM_rst shifts to a low level, and thus the seventh PMOS transistor P7 becomes turned on.

When the seventh PMOS transistor P7 is turned on, the node K4 maintains a high level. Therefore, the second pull-up signal PUNOM of a high level is outputted.

The third pull-up circuit 414, according to an example, includes $10^{th}$ to $13^{rd}$ PMOS transistors P10 to P13 and $19^{th}$ to $26^{th}$ NMOS transistors N19 to N26.

The $10^{th}$ PMOS transistors P10 and the $19^{th}$ and the $20^{th}$ NMOS transistors N19 and N20 are coupled in series between the ground node and the power supply voltage VCC of, according to an example, 1.8 V.

The gates of the $11^{th}$ PMOS transistor P11 and the $19^{th}$ NMOS transistor N19 are coupled in common to the node K5. A node where the $10^{th}$ PMOS transistor P10 and the $19^{th}$ NMOS transistor N19 are connected is coupled to the output terminal of a sixth pull-up signal PUNOM_18.

The signal NOM_18 is inputted to the gate of the $20^{th}$ NMOS transistor N20.

The $11^{th}$ PMOS transistor P11 and the $21^{st}$ and the $22^{nd}$ NMOS transistors N21 and N22 are also coupled in series between the power supply voltage VCC and the ground node.

The gates of the $11^{th}$ PMOS transistor P11 and the $21^{st}$ NMOS transistor N21 are coupled in common to the node K5. A node where the $11^{th}$ PMOS transistor P11 and the $21^{st}$ NMOS transistor N21 are connected is coupled to the output terminal of the sixth pull-up signal PUNOM_18.

The signal OVD1_18 is inputted to the gate of the $22^{nd}$ NMOS transistor N22.

The $12^{th}$ PMOS transistor P12 and the $23^{rd}$ and the $24^{th}$ NMOS transistors N23 and N24 are coupled in series between the power supply voltage VCC and the ground node. The gate of the $23^{rd}$ NMOS transistor N23 is coupled to the node K5. A node where the $12^{th}$ PMOS transistor P12 and the $23^{rd}$ NMOS transistor N23 are connected is coupled to an output terminal from which the fifth pull-up signal PUUD_18 is outputted. Furthermore, the signal SUP_18 is inputted to the gates of the $12^{th}$ PMOS transistor P12 and the $24^{th}$ NMOS transistor N24.

The $13^{th}$ PMOS transistor P13 and the $25^{th}$ and the $26^{th}$ NMOS transistors N25 and N26 are coupled in series between the power supply voltage VCC and the ground node.

The gates of the $13^{th}$ and the $25^{th}$ NMOS transistors N13 and N25 are coupled in common to the node K5. A node where the $13^{th}$ PMOS transistor P13 and the $25^{th}$ NMOS transistor N24 are connected is coupled to the output terminal from which the fifth pull-up signal PUUD_18 is outputted.

Furthermore, the signal OVD1_18 is inputted to the gate of the $26^{th}$ NMOS transistor N26.

The fourth pull-up circuit 415, according to an example, includes $14^{th}$ to $17^{th}$ PMOS transistors P14 to P17 and $27^{th}$ to $34^{th}$ NMOS transistors N27 to N34.

The $14^{th}$ PMOS transistor P14 and the $27^{th}$ and the $28^{th}$ NMOS transistors N27 and N28 are coupled in series between the power supply voltage VCC and the ground node. The gates of the $14^{th}$ PMOS transistor P14 and the $27^{th}$ NMOS transistor N27 are coupled in common to the node K1. A node where the $14^{th}$ PMOS transistor P14 and the $27^{th}$ NMOS transistor N27 are connected is coupled to a node K6. A third pull-up signal PUOVD1 is outputted from the node K6.

The signal OVD1_33 indicating, the first over-driver mode when the driving voltage is 3.3 V, is inputted to the gate of the $28^{th}$ NMOS transistor N28.

The $29^{th}$ and the $30^{th}$ NMOS transistors N29 and N30 are coupled in series between the node K6 and the ground node. The gate of the $29^{th}$ NMOS transistor N29 is coupled to the node K1. The signal OVD2_33, indicating the second over-driver mode when the driving voltage is 3.3 V, is inputted to the gate of the $30^{th}$ NMOS transistor N30.

The $31^{st}$ and the $32^{nd}$ NMOS transistors N31 and N32 are coupled in series between the node K6 and the ground node. The gate of the $31^{st}$ NMOS transistor N31 is coupled to the node K1. The signal OVD2_18, indicating the second over-driver mode when the driving voltage is 1.8 V, is inputted to the gate of the $32^{nd}$ NMOS transistor N32.

The $33^{rd}$ and the $34^{th}$ NMOS transistors N33 and N34 are coupled in series between the node K6 and the ground node. The gate of the $33^{rd}$ NMOS transistor N33 is coupled to a node K8.

The node K8 is coupled to an output terminal of a third inverter IN3. The third inverter IN3 inverts the data signal P18.

The signal OVD1_18 is inputted to the gate of the $34^{th}$ NMOS transistor N34.

A first over-driver mode reset signal OVD1_rst is inputted to the $15^{th}$ PMOS transistor P15. The first over-driver mode reset signal OVD1_rst is the output of a second OR gate OR2.

The second OR gate OR2 performs an OR operation on the signal OVD1_18 and the signal OVD1_33.

The $16^{th}$ and the $17^{th}$ PMOS transistors P16 and P17 are coupled in series between the power supply voltage VCC and the node K6. The output of a fourth inverter IN4 is inputted to the gate of the $16^{th}$ PMOS transistor P16. The fourth inverter IN4 inverts the signal OVD1_18.

The gate of the $17^{th}$ PMOS transistor P17 is coupled to a node K8.

The fifth pull-up circuit 416, according to an example, includes $18^{th}$ to $21^{st}$ PMOS transistors P18 to P21 and $35^{th}$ to $38^{th}$ NMOS transistors N35 to N38.

The $18^{th}$ PMOS transistor P18 and the $35^{th}$ and the $36^{th}$ NMOS transistors N35 and N36 are coupled in series between the power supply voltage VCC and the ground node. The gates of the $18^{th}$ PMOS transistor P18 and the $35^{th}$ NMOS transistor N35 are coupled to the node K1.

A node where the $18^{th}$ PMOS transistor P18 and the $35^{th}$ NMOS transistor N35 are connected is coupled to a node K7. A fourth pull-up signal PUOVD2 is outputted from the node K7.

A signal OVD2_33 is inputted to the gate of the $36^{th}$ NMOS transistor N36.

The $19^{th}$ PMOS transistor P19 is coupled between the power supply voltage VCC and the node K7. A second over-driver mode reset signal OVD2_rst is inputted to the gate of the $19^{th}$ PMOS transistor P19.

The second over-driver mode reset signal OVD2_rst is the output of a third OR gate OR3. The third OR gate OR3 performs an OR operation on the signal OVD2_18 and the signal OVD2_33.

The $37^{th}$ and the $38^{th}$ NMOS transistors N37 and N38 are coupled in series between the node K7 and the ground node. The gate of the $37^{th}$ NMOS transistor N37 is coupled to the node K8. Furthermore, the signal OVD2_18 is inputted to the gate of the $38^{th}$ NMOS transistor N38.

The $20^{th}$ and the $21^{st}$ PMOS transistors P20 and P21 are coupled in series between the power supply voltage VCC and the node K7. The output of a fifth inverter IN5 is inputted to the gate of the $20^{th}$ PMOS transistor P20.

The fifth inverter IN5 inverts the signal OVD2_18.

The gate of the $21^{st}$ PMOS transistor P21 is coupled to the node K8.

The sixth pull-up circuit 417, according to an example, includes $22^{nd}$ to $25^{th}$ PMOS transistors P22 to P25 and $39^{th}$ to $42^{nd}$ NMOS transistors N39 to N42.

The $22^{nd}$ PMOS transistor P22 and the $39^{th}$ and the $40^{th}$ NMOS transistors N39 and N40 are coupled in series between the power supply voltage VCC and the ground node. The signal OVD2_18 is inputted to the gates of the $22^{nd}$ PMOS transistor P20 and the $40^{th}$ NMOS transistor N40. An eighth pull-up signal PUOVD2_18 is outputted from a node where the $22^{nd}$ PMOS transistor P22 and the $39^{th}$ NMOS transistor N39 are connected.

The $23^{rd}$ PMOS transistor P23 is coupled between the power supply voltage VCC and the output terminal of an eighth pull-up signal PUOVD2_18. The gate of the $23^{rd}$ PMOS transistor P23 is coupled to the node K8.

The $24^{th}$ PMOS transistor P24 and the $41^{st}$ and the $42^{nd}$ NMOS transistors N41 and N42 are coupled in series between the power supply voltage VCC and the ground node. A seventh pull-up signal PUOVD1_18 is outputted from a node where the $24^{th}$ PMOS transistor P24 and the $41^{st}$ NMOS transistor N41 are connected. The signal OVD1_18 is inputted to the gates of the $24^{th}$ PMOS transistor P24 and the $42^{nd}$ NMOS transistor N42.

The $25^{th}$ PMOS transistor P25 is coupled between the power supply voltage VCC and the output terminal of the seventh pull-up signal PUOVD1_18. The gate of the $25^{th}$ PMOS transistor P25 is coupled to the node K8.

The operation of the output pre-driver circuit 410 is described below.

According to an example, in the under mode of 3.3 V which is a default mode, signals NOM_33, SUP_18, NOM_18, OVD1_33, OVD1_18, OVD2_33, and OVD2_18 of a low level are inputted.

When the signal NOM_33 and the signal NOM_18 are in a low level, the nominal mode reset signal NOM_rst shifts to a low level. In response thereto, the seventh PMOS transistor P7 is turned on.

When the seventh PMOS transistor P7 is turned on, the second pull-up signal PUNOM becomes a high level.

Furthermore, when both the signal OVD1_33 and the signal OVD1_18 are in a low level, the first over-driver reset signal OVD1_rst shifts to a low level. In response thereto, the $15^{th}$ PMOS transistor P15 is turned on. When the $15^{th}$ PMOS transistor P15 is turned on, the third pull-up signal PUOVD1 becomes a high level.

When both the signal OVD2_33 and the signal OVD2_18 are also in a low level, the second over-driver reset signal OVD2_rst also shifts to a low level. In response thereto, the $19^{th}$ PMOS transistor P19 is turned on.

When the 19 PMOS transistor P19 is turned, the fourth pull-up signal PUOVD2 becomes a high level.

Furthermore, when the signal NOM_18 of a low level is inputted, the tenth PMOS transistor P10 is turned on, so that the sixth pull-up signal PUNOM_18 also shifts to a high level.

When the signal OVD1_18 is in a low level, the $24^{th}$ PMOS transistor P24 is turned on and thus the seventh pull-up signal PUOVD1_18 becomes a high level. When the signal OVD2_18 is in a low level, the $22^{nd}$ PMOS transistor P22 is turned on and thus the eighth pull-up signal PUOVD2_18 also becomes a high level.

To sum up, each of the second to the eighth pull-up signals PUNOM, PUOVD1, PUOVD2, PUUD_18, PUNOM_18, PUOVD1_18, and PUOVD2_18 becomes a high level. However, since the mode is the under mode, the first pull-up circuit 412 changes the pull-up signal, i.e., the first pull-up signal PUUD depending on the data signal.

When the data signal P of a high level is inputted, the second NMOS transistor N2 is turned on and thus voltage of the node K1 shifts to a low level.

When the voltage of the node K1 shifts to a low level, the third PMOS transistor P3 of the first pull-up circuit 412 is turned on.

Furthermore, since the signal SUP_18 is in a low level, the tenth NMOS transistor N10 is turned off, and the first inverter IN1 outputs a signal of a high level. In response thereto, the fourth NMOS transistor N4 is turned on. Consequently, the first pull-up signal PUUD of a high level is outputted.

When the data signal P of a low level is inputted, however, the first NMOS transistor N1 is turned on because the data signal PN is in a high level. Accordingly, voltage of the node K1 shifts a high level.

When the voltage of the node K1 shifts to a high level, the first pull-up signal PUUD shifts to a low level because the third NMOS transistor N3 of the first pull-up circuit 412 is turned on.

As described above, in the under mode of 3.3 V, each of the second to the eighth pull-up signals PUNOM, PUOVD1, PUOVD2, PUUD_18, PUNOM_18, PUOVD1_18, and PUOVD2_18 maintains a high level, and the first pull-up signal PUUD shifts to a high level or a low level in response to the data signals P and PN.

In case of the under mode when the driving voltage is 1.8 V, the signal SUP_18 shifts to a high level. Each of the second to fourth pull-up signals PUNOM, PUOVD1, PUOVD2, and each of the sixth to eighth pull-up signals PUNOM_18, PUOVD1_18, and PUOVD2_18 becomes a high level because each of the signals NOM_18, NOM_33, OVD1_18, OVD1_33, OVD2_18, and OVD2_22 is in a low level.

Furthermore, when the signal SUP_18 shifts to a high level, the tenth NMOS transistor N10 and the $24^{th}$ NMOS transistor N24 are turned on. Also, when the signal SUP_18 shifts to a high level, the first inverter IN1 outputs a signal of a low level. In response thereto, the fourth NMOS transistor N4 is turned off, and the fourth PMOS transistor P4 is turned on.

Furthermore, when the data signal P18 of a high level is inputted, the second inverter IN2 outputs a signal of a low level. When the second inverter IN2 outputs a signal of a low level, voltage of the node K5 shifts to a low level. Accordingly, the fifth PMOS transistor P5 is turned on, and thus the first pull-up signal PUUD of a high level is outputted.

Furthermore, when the $13^{th}$ PMOS transistor P13 is turned on in the state in which voltage of the node K5 is in a low level, the fifth pull-up signal PUUD_18 shifts to a high level.

When the data signal P18 shifts to a low level, voltage of the node K5 shifts to a high level by means of the second inverter IN2.

When voltage of the node K5 shifts to in a high level, the first pull-up signal PUUD shifts to a low level because the ninth NMOS transistor N9 is turned on. Furthermore, when voltage of the node K5 shifts to a high level, the $23^{rd}$ NMOS transistor N23 is turned on and thus the fifth pull-up signal PUUD_18 also shifts to a low level.

To sum up, in the under mode when the driving voltage is 1.8 V, the voltage levels of the first and the fifth pull-up signals PUUD and PUUD_18 are shifted in response to the data signal P18.

The nominal mode is described below.

In the nominal mode of 3.3 V, all the signals SUP_18, NOM_18, OVD1_18, OVD1_33, OVD2_18, and OVD2_33 other than the signal NOM_33 shift to a low level.

In response thereto, each of the first and the second over-driver reset signals OVD1_rst and OVD2_rst shifts to a low level, and each of the third and the fourth pull-up signals PUOVD1 and PUOVD2 becomes a high level.

Furthermore, while each of the fifth to eighth pull-up signals PUUD_18, PUNOM_18, PUOVD1_18, and PUOVD2_18 maintains a high level, the first and the second pull-up circuits 412 and 413 changes the pull-up signal depending on the data signals.

Since the first pull-up circuit 412 is operated by default, the first pull-up signal PUUD1 is shifted to a high level or a low level in response to the data signals P and PN.

Furthermore, since of the 12$^{th}$ NMOS transistor N12 of the second pull-up circuit 413 is turned on in response to the signal NOM_33 of a high level, the second pull-up signal PUNOM outputted from the node K4 is changed according to voltage of the node K1.

In other words, when voltage of the node K1 is changed in response to the data signals P and PN, the level of the second pull-up signal PUNOM is also shifted.

Likewise, in case of the nominal mode when the driving voltage is 1.8 V, the signal SUP_18 and the signal NOM_18 become a high level.

When the signal NOM_18 shifts to a high level, the eighth PMOS transistor P8 and the 18$^{th}$ and the 20$^{th}$ NMOS transistor N18 and N20 are turned on.

Furthermore, the levels of the first and the second pull-up signals PUUD and PUNOM are shifted in response to the data signal P18. Also, the fifth and the sixth pull-up signals PUUD_18 and PUNOM_18 are shifted in response to the data signal P18.

In case of the first over-driver mode when the driving voltage is 3.3 V, the signal NOM_33 and the signal OVD1_33 shift to a high level.

Each of the fourth to eighth pull-up signals PUOVD2, PUUD_18, PUNOM_18, PUOVD1_18, and PUOVD2_18 maintains a high level.

On the other hand, the first to third pull-up signals PUUD, PUNOM, and PUOVD1 are shifted in response to the data signals P and PN.

In case of the first over-driver mode when the driving voltage is 1.8 V, the signals SUP_18, NOM_18, and OVD1_18 of a high level are applied.

Accordingly, the first to third pull-up signals PUUD, PUNOM, and PUOVD1 and the fifth to seventh pull-up signals PUUD_18, PUNOM_18, and PUOVD1_18 are shifted in response to the data signal P18.

In case of the second over-driver mode when the driving voltage is 3.3 V, the signals NOM, OVD1, and OVD2 of a high level are applied.

Accordingly, the first to fourth pull-up signals PUUD, PUNOM, PUOVD1, and PUOVD2 are shifted in response to the data signals P and PN.

In case of the second over-driver mode when the driving voltage is 1.8 V, the signals SUP_18, NOM_18, OVD1_18, and OVD2_18 of a high level are applied.

Accordingly, the first to eighth pull-up signals PUUD, PUNOM, PUOVD1, PUOVD2, PUUD_18, PUNOM_18, PUOVD1_18, and PUOVD2_18 are shifted in response to the data signal P18.

The operation of the output driver 430 according to the first to eighth pull-up signals PUUD, PUNOM, PUOVD1, PUOVD2, PUUD_18, PUOVD1_18, and PUOVD2_18 which are outputted in response to the signals SUP_18, NOM_18, NOM_33, OVD1_18, OVD1_33, OVD2_18, and OVD2_33 is described later.

The pull-up output pre-driver circuit 420 outputs the first to eighth pull-up signals PUUD, PUNOM, PUOVD1, PUOVD2, PUUD_18, PUOVD1_18, and PUOVD2_18 according to a driving voltage and a driver mode so that the output driver 430 pulls up the data line DQ when the data signal P or P18 is in a high level.

According to an example, the pull-down output pre-driver 420 has a similar configuration and operation as the pull-up output pre-driver 410.

Figure 4C:
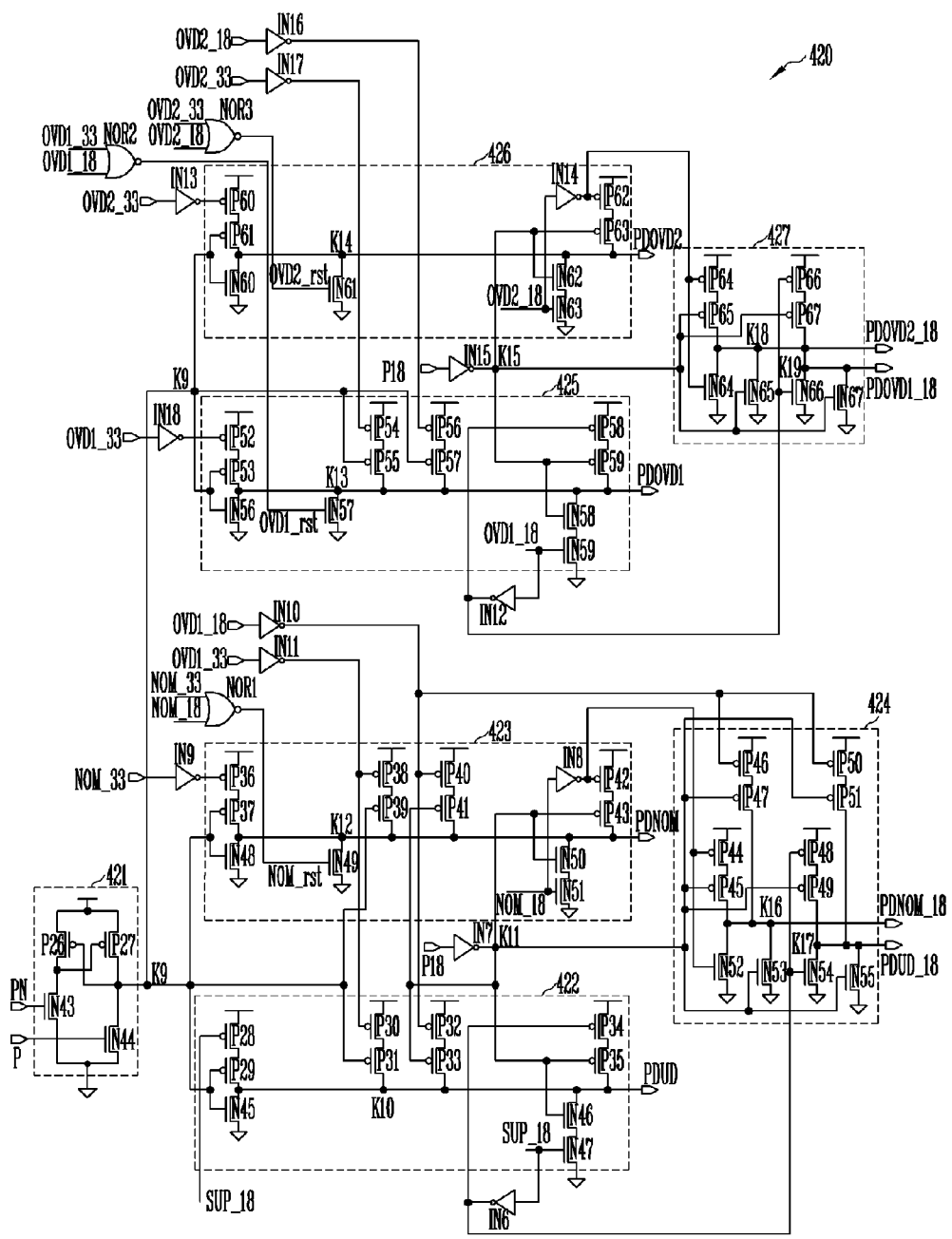
FIG. 4C shows a pull-down output pre-driver of FIG. 4A.

FIG. 4C shows the pull-down output pre-driver 420 of FIG. 4A.

Referring to FIG. 4C, the pull-down output pre-driver circuit 420 includes a data input circuit 421, first to sixth pull-down circuits 422 to 427, and circuits for inputting and resetting signals.

The data input circuit 421, according to an example, has the same configuration as the data input circuit 411 of the pull-up output pre-driver circuit 410.

In the under mode when the driving voltage is 3.3 V, the first pull-down circuit 422 is operated. The first pull-down circuit 422, according to an example, is operated by default. In the under mode when the driving voltage is 1.8 V, the first pull-down circuit 422 and the third pull-down circuit 424 are operated.

In the nominal mode when the driving voltage is 3.3 V, the first and the second pull-down circuits 422 and 423 are operated. In the nominal mode when the driving voltage is 1.8 V, the first to third pull-down circuits 422 to 424 are operated.

In the first over-driver mode when the driving voltage is 3.3 V, the first and the second pull-down circuits 422 and 423 and the fourth pull-down circuit 425 are operated. In the first over-driver mode when the driving voltage is 1.8 V, the first to fourth pull-down circuits 422 to 425 are operated.

In the second over-driver mode when the driving voltage is 3.3 V, the first and the second pull-down circuits 422 and 423 and the fourth and the fifth pull-down circuits 425 and 426 are operated. In the second over-driver mode when the driving voltage is 1.8 V, the first to sixth pull-down circuits 422 to 427 are operated.

The configuration of the pull-down output pre-driver 420 is described in more detail.

The data input circuit 421, according to an example, includes 26$^{th}$ and 27$^{th}$ PMOS transistors P26 and P27 and 43$^{rd}$ and 44$^{th}$ NMOS transistors N43 and N44. The data input circuit 421 has a similar configuration of the data input circuit 411 of FIG. 4B, and a description of the circuits thereof is omitted.

The first pull-down circuit 422, according to an example, includes 28$^{th}$ to 35$^{th}$ PMOS transistors P28 to P35 and 45$^{th}$ to 47$^{th}$ NMOS transistors N45 to N47.

The 28$^{th}$ and the 29$^{th}$ PMOS transistors P28 and P29 and the 45$^{th}$ NMOS transistor N45 are coupled in series between the power supply voltage VCC and the ground node.

The signal SUP_18 is inputted the gate of the 28$^{th}$ PMOS transistor P28. Furthermore, the gates of the 29$^{th}$ PMOS transistor P29 and the 45$^{th}$ NMOS transistor N45 are coupled in common to a node K9.

A node where the 29$^{th}$ PMOS transistor P29 and the 45$^{th}$ NMOS transistor N45 are connected is a node K10. A first pull-down signal PDUD is outputted from the node K10.

The 30$^{th}$ and the 31$^{st}$ PMOS transistors P30 and P31 are coupled in series between the power supply voltage and the node K10. The gate of the 30$^{th}$ PMOS transistor P30 is coupled to the output terminal of an eleventh inverter IN11. The eleventh inverter IN11 inverts the signal OVD1_33. Furthermore, the gate of the 31$^{st}$ PMOS transistor P31 is coupled to the node K9.

The 32$^{nd}$ and the 33$^{rd}$ PMOS transistors P32 and P33 are coupled in series between the power supply voltage and the node K10. The gate of the 32$^{nd}$ PMOS transistor P32 is coupled to the output terminal of a tenth inverter IN10. The tenth inverter IN10 inverts the signal OVD1_18.

The $34^{th}$ and the $35^{th}$ PMOS transistors P34 and P35 are coupled in series between the power supply voltage VCC and the node K10. The gate of the $34^{th}$ PMOS transistor P34 is coupled to the output terminal of a sixth inverter IN6. The sixth inverter IN6 inverts the signal SUP_18.

The gate of the $35^{th}$ PMOS transistor P35 is coupled to a node K11.

The node K11 is coupled to the output terminal of a seventh inverter IN7, and the seventh inverter IN7 inverts the data signal P18.

The $46^{th}$ and the $47^{th}$ NMOS transistors N46 and N47 are coupled in series between a node K10 and the ground node. The gate of the $46^{th}$ NMOS transistor N46 is coupled to the node K11, and the signal SUP_18 is inputted to the gate of the $47^{th}$ NMOS transistor N47.

The second pull-down circuit 423, according to an example, includes $36^{th}$ to $43^{rd}$ PMOS transistors P36 to P43 and $48^{th}$ to $51^{st}$ NMOS transistors N48 to N51.

The $36^{th}$ and the $37^{th}$ PMOS transistors P36 and P37 and the $48^{th}$ NMOS transistor N48 are coupled in series between the power supply voltage VCC and the ground node. The gate of the $36^{th}$ PMOS transistor P36 is coupled to the output terminal of a ninth inverter IN9. The ninth inverter IN9 inverts the signal NOM_33.

The gates of the $37^{th}$ PMOS transistor P37 and the $48^{th}$ NMOS transistor N48 are coupled in common to the node K9.

A node where the $37^{th}$ PMOS transistor P37 and the $48^{th}$ NMOS transistor N48 are connected is coupled to a node K12. A second pull-down signal PDNOM is outputted from the node K12.

The $49^{th}$ NMOS transistor N49 is coupled between the node K12 and the ground node, and a nominal mode reset signal NOM_rst is inputted to the gate of the $49^{th}$ NMOS transistor N49.

The nominal mode reset signal NOM_rst is the output of a first NOR gate NOR1. The signal NOM_18 and the signal NOM_33 are inputted to the first NOR gate NOR1. The first NOR gate NOR1 outputs a signal of a high level when both the signal NOM_18 and the signal NOM_33 of a low level are received.

The $38^{th}$ and the $39^{th}$ PMOS transistors P38 and P39 are coupled in series between the power supply voltage VCC and the node K12. The gate of the $38^{th}$ PMOS transistor P38 is coupled to the output terminal of the eleventh inverter IN11. The gate of the $39^{th}$ PMOS transistor P39 is coupled to the node K9.

The $40^{th}$ and the $41^{st}$ PMOS transistors P40 and P41 are also coupled in series between the power supply voltage VCC and the node K12. The gate of the $40^{th}$ PMOS transistor P40 is coupled to the output terminal of the tenth inverter IN10. The gate of the $41^{st}$ PMOS transistor P41 is coupled to the node K11.

The $42^{nd}$ and the $43^{rd}$ PMOS transistors P42 and P43 are coupled between the power supply voltage VCC and the node K12. The gate of the $42^{nd}$ PMOS transistor P42 is coupled to the output terminal of the eighth inverter IN8. The eighth inverter IN8 inverts the signal NOM_18.

The gate of the $43^{rd}$ PMOS transistor P43 is coupled to the node K11.

The $50^{th}$ and the $51^{st}$ NMOS transistors N50 and N51 are coupled in series between the node K12 and the ground node. The gate of the $50^{th}$ NMOS transistor N50 is coupled to the node K11, and the signal NOM_18 is inputted to the gate of the $51^{st}$ NMOS transistor N51.

The third pull-down circuit 424, according to an example, includes $44^{th}$ to $51^{st}$ PMOS transistors P44 to P51 and $52^{nd}$ to $55^{th}$ NMOS transistors N52 to N55.

The $44^{th}$ and the $45^{th}$ PMOS transistors P44 and P45 are coupled in series between the power supply voltage VCC and the node K11. The gate of the $44^{th}$ PMOS transistor P44 is coupled to the output terminal of an eighth inverter IN8, and the gate of the $45^{th}$ PMOS transistor P45 is coupled to the node K11.

The $46^{th}$ and the $47^{th}$ PMOS transistors P46 and P47 are coupled in series between the power supply voltage VCC and a node K16. The gate of the $46^{th}$ PMOS transistor P46 is coupled to the output terminal of the tenth inverter IN10, and the gate of the $47^{th}$ PMOS transistor P47 is coupled to the node K11. A sixth pull-down signal PDNOM_18 is outputted from the node K16.

The $48^{th}$ and the $49^{th}$ PMOS transistors P48 and P49 are coupled in series between the power supply voltage and a node K17. The gate of the $48^{th}$ PMOS transistor P48 is coupled to the output terminal of the sixth inverter IN6, and the gate of the $49^{th}$ PMOS transistor P49 is coupled to the node K11.

A fifth pull-down signal PDUD_18 is outputted from the node K17.

Furthermore, the $50^{th}$ and the $51^{st}$ POMS transistors P50 and P51 are coupled in series between the power supply voltage and the node K17. The gate of the $50^{th}$ PMOS transistor P50 is coupled to the output terminal of the tenth inverter IN10, and the gate of the $51^{st}$ PMOS transistor P51 is coupled to the node K11.

The $52^{nd}$ and the $53^{rd}$ NMOS transistors N52 and N53 are coupled between the node K16 and the ground node. The gate of the $52^{nd}$ NMOS transistor N52 is coupled to the output terminal of the eighth inverter IN8, and the gate of the $53^{rd}$ NMOS transistor N53 is coupled to the node K11.

The $54^{th}$ and the $55^{th}$ NMOS transistors N54 and N55 are coupled between the node K17 and the ground node. The gate of the $54^{th}$ NMOS transistor N54 is coupled to the output terminal of the sixth inverter IN6, and the gate of the $55^{th}$ NMOS transistor N55 is coupled to the node K11.

The fourth pull-down circuit 425, according to an example, includes $52^{nd}$ to $59^{th}$ PMOS transistors P52 to P59 and $56^{th}$ to $59^{th}$ NMOS transistors N56 to N59.

The $52^{nd}$ and the $53^{rd}$ PMOS transistors P52 and P53 and the $56^{th}$ NMOS transistor N56 are coupled in series between the power supply voltage and the ground node. The gate of the $52^{nd}$ PMOS transistor P52 is coupled to the output terminal of an $18^{th}$ inverter IN18. The $18^{th}$ inverter IN18 inverts the signal OVD1_33.

The gates of the $53^{rd}$ PMOS transistor P53 and the $56^{th}$ NMOS transistor N56 are in common coupled to the node K9. A node where the $53^{rd}$ PMOS transistor P53 and the $56^{th}$ NMOS transistor N56 are connected is coupled to a node K13.

A third pull-down signal PDOVD1 is outputted from the node K13.

The $57^{th}$ NMOS transistor N57 is coupled between the node K13 and the ground node. The first over-driver mode reset signal OVD1_rst is inputted to the gate of the $57^{th}$ NMOS transistor N57.

The first over-driver mode reset signal OVD1_rst is the output of a second NOR gate NOR2. The signal OVD1_18 and the signal OVD1_33 are inputted to the second NOR gate NOR2.

The $54^{th}$ and the $55^{th}$ PMOS transistors P54 and P55 are coupled in series between the power supply voltage VCC and the node K13. The gate of the $54^{th}$ PMOS transistor P54 is coupled to the output terminal of the 17$^{th}$ inverter IN17. The 17 inverter IN17 inverts the signal OVD2_33.

The gate of the 55$^{th}$ PMOS transistor P55 is coupled to the node K9.

The 56$^{th}$ and the 57$^{th}$ PMOS transistors P56 and P57 are coupled in series between the power supply voltage and the node K13. The gate of the 56$^{th}$ PMOS transistor P56 is coupled to the output terminal of a 16$^{th}$ inverter IN16. The 16$^{th}$ inverter IN16 inverts the signal OVD2_18.

The gate of the 57$^{th}$ PMOS transistor P57 is coupled to the node K9.

The 58$^{th}$ and the 59$^{th}$ PMOS transistors P58 and P59 are coupled in series between the power supply voltage VCC and the node K13. The gate of the 58$^{th}$ PMOS transistor P58 is coupled to the output terminal of a 12$^{th}$ inverter IN12. The 12$^{th}$ inverter IN12 inverts the signal OVD1_18.

The gate of the 59$^{th}$ PMOS transistor P59 is coupled to a node K15. The node K15 is coupled to the output terminal of the 15$^{th}$ inverter IN15. The 15$^{th}$ inverter IN15 inverts the data signal P18.

The 58$^{th}$ and the 59$^{th}$ NMOS transistors N58 and N59 are coupled in series between the node K13 and the ground node. The gate of the 58$^{th}$ NMOS transistor N58 is coupled to the node K15, and the signal OVD1_18 is inputted to the gate of the 59$^{th}$ NMOS transistor N59.

The fifth pull-down circuit 426, according to an example, includes 60$^{th}$ to 63$^{rd}$ PMOS transistors P60 to P63 and 60$^{th}$ to 63$^{rd}$ NMOS transistors N60 to N63.

The 60$^{th}$ and the 61$^{st}$ PMOS transistors P60 and P61 and the 60$^{th}$ NMOS transistor N60 are coupled in series between the power supply voltage VCC and the ground node.

The gate of the 60$^{th}$ PMOS transistor P60 is coupled to the output terminal of a 13$^{th}$ inverter 13. The 13$^{th}$ inverter IN13 inverts the signal OVD2_33.

The gates of the 61$^{st}$ PMOS transistor P61 and the 60$^{th}$ NMOS transistor N60 are coupled in common to the node K9. Furthermore, a node where the 61$^{st}$ PMOS transistor P61 and the 60$^{th}$ NMOS transistor N60 are connected is coupled to a node K14. The fourth pull-down signal PDOVD2 is outputted from the node K14.

The 61$^{st}$ NMOS transistor N61 is coupled between the node K14 and the ground node. The second over-driver mode reset signal OVD2_rst is inputted to the gate of the 61$^{st}$ NMOS transistor N61.

The second over-driver mode reset signal OVD2_rst is the output of a third NOR gate NOR3. The signal OVD2_18 and the signal OVD2_33 are inputted to the third NOR gate NOR3.

The 62$^{nd}$ and the 63$^{rd}$ PMOS transistors P62 and P63 are coupled in series between the power supply voltage and the node K14. The gate of the 62$^{nd}$ PMOS transistor P62 is coupled to the output terminal of a 14$^{th}$ inverter IN14. The 14$^{th}$ inverter IN14 inverts the signal OVD2_18.

The gate of the 63$^{rd}$ PMOS transistor P63 is coupled to the node K15.

The 62$^{nd}$ and the 63$^{rd}$ NMOS transistors N62 and N63 are coupled in series between the node K14 and the ground node. The gate of the 62$^{nd}$ NMOS transistor N62 is coupled to the node K15. The signal OVD2_18 is inputted to the gate of the 63$^{rd}$ NMOS transistor N63.

The sixth pull-down circuit 427, according to an example, includes 64$^{th}$ to 67$^{th}$ PMOS transistors P64 to P67 and 64$^{th}$ to 67$^{th}$ NMOS transistors N64 to N67.

The 64$^{th}$ and the 65$^{th}$ PMOS transistors P64 and P65 are coupled in series between the power supply voltage and a node K18. The gate of the 64$^{th}$ PMOS transistor P64 is coupled to the output terminal of the 14$^{th}$ inverter IN14. The gate of the 65$^{th}$ PMOS transistor P65 is coupled to the node K15.

The 66$^{th}$ and the 67$^{th}$ PMOS transistors P66 and P67 are coupled in series between the power supply voltage VCC and a node K19. The gate of the 66$^{th}$ PMOS transistor P66 is coupled to the output terminal of the 12$^{th}$ inverter IN12. Furthermore, the gate of the 67$^{th}$ PMOS transistor P67 is coupled to the node K15.

The 64$^{th}$ and the 65$^{th}$ NMOS transistors N64 and N65 are coupled between the node K18 and the ground node. The gate of the 64$^{th}$ NMOS transistor N64 is coupled to the output terminal of the 14$^{th}$ inverter IN14. The gate of the 65$^{th}$ NMOS transistor N65 is coupled to the node K15.

The 66$^{th}$ and the 67$^{th}$ NMOS transistors N66 and N67 are coupled between the node K19 and the ground node. The gate of the 66$^{th}$ NMOS transistor N66 is coupled to the output terminal of the 12$^{th}$ inverter IN12. The gate of the 67$^{th}$ NMOS transistor N67 is coupled to the node K15.

The operation of the pull-down output pre-driver 420 configured as above is described below.

The signals applied according to the driving voltages and the driver modes are the same as those of Table 1.

In the under mode when the driving voltage is 3.3 V which is operated by default, all the signals SUP_18, NOM_18, NOM_33, OVD1_18, OVD1_33, OVD2_18, and OVD2_33 of a low level are applied. In response thereto, the 28 PMOS transistor P28 is turned on.

Furthermore, voltage of the node K9 shifts to low level or a high level in response to the data signals P and PD. Accordingly, voltage of the node K10 is also shifted by the 29$^{th}$ PMOS transistor P29 and the 45$^{th}$ NMOS transistor N45. Thus, the first pull-down signal PDUD is shifted in response to the data signals P and PD.

When each of the signals SUP_18, NOM_18, NOM_33, OVD1_18, OVD1_33, OVD2_18, and OVD2_33 is in a low level, the nominal mode reset signal NOM_rst, the first over-driver mode reset signal OVD1_rst, and the second over-driver mode reset signal OVD2_rst of a high level are outputted. Accordingly, each of the second to eighth pull-down signals PDNOM, PDOVD1, PDOVD2, PDUD_18, PDNOM_18, PDOVD1_18, and PDOVD2_18 becomes a low level.

In the under mode when the driving voltage is 1.8 V, only the signal SUP_18 shifts to a high level. In response thereto, the 28$^{th}$ PMOS transistor P28 is turned off, and the 34$^{th}$ and the 48$^{th}$ PMOS transistors P34 and P48 are turned on. Furthermore, the 47$^{th}$ NMOS transistor N47 is also turned on.

When the data signal P18 is inputted, the first down signal PDUD and the fifth down signal PDUD_18 are outputted. Each of the second to fourth down signals PDNOM, PDOVD1, and PDOVD2 and the sixth to eighth pull-down signals PDNOM_18, PDOVD1_18, and PDOVD2_18 maintains a low level.

In the nominal mode when the driving voltage is 3.3 V, only the signal NOM_33 of a high level is applied. The first pull-down circuit 422 is operated by default, and thus the first pull-down signal PDUD is outputted according to voltage the node K9.

Furthermore, in response to the signal NOM_33 of a high level, the ninth inverter IN9 outputs a signal of a low level, and the 36$^{th}$ PMOS transistor P36 is turned on.

When the signal NOM_33 is in a high level, the nominal mode reset signal NOM_rst shifts to a low level. Furthermore, the second pull-down signal PDNOM is outputted according to voltage of the node K9.

In the nominal mode when the driving voltage is 3.3 V, the first and the second pull-down signals PDUD and PDNOM are outputted in response to the data signals P and PD. Each of the third to eighth pull-down signals PDOVD1, PDOVD2, PDUD_18, PDNOM_18, PDOVD1_18, and PDOVD2_18 maintains a low level.

In the nominal mode when the driving voltage is 1.8 V, the signal NOM_18 and the signal SUP_18 of a high level are applied.

In response to the signal SUP_18 of a high level, the 28$^{th}$ PMOS transistor P28 is turned off, and the 34$^{th}$ and the 48$^{th}$ PMOS transistors P34 and P48 and the 47$^{th}$ NMOS transistor N47 are turned on. Furthermore, the 42$^{nd}$ PMOS transistor P42 and the 51$^{st}$ NMOS transistor N51 are turned on.

Furthermore, when the data signal P18 is inputted, the seventh inverter IN7 inverts the data signal P18. The output terminal of the seventh inverter IN7 is coupled to the node K11.

Accordingly, the first pull-down signal PDUD, the second pull-down signal PDNOM, and the fifth and the sixth pull-down signals PDUD_18 and PDNOM_18 are outputted according to voltage of the node K11.

Each of the third and the fourth pull-down signals PDOVD1 and PDOVD2 and the seventh and the eighth pull-down signals PDOVD1_18 and PDOVD2_18 are fixed to a low level.

In the first over-driver mode when the driving voltage is 3.3 V, the signal NOM_33 and the signal OVD1_33 of a high level are applied.

The first pull-down circuit 422 is operated by default, and the second pull-down circuit 423 is operated in response to the signal NOM_33.

Furthermore, the fourth pull-down circuit 425 is operated in response to the signal OVD1_33.

That is, since the 52$^{nd}$ PMOS transistor P52 is turned on in response to the signal OVD1_33 of a high level, the third pull-down signal PDOVD1 is outputted in response to voltage of the node K9.

Thus, in the first over-driver mode when the driving voltage is 3.3 V, the first to third pull-down signals PDUD, PDNOM, and PDOVD1 are outputted. Furthermore, each of the fourth to eighth pull-down signals PDOVD2, PDUD_18, PDNOM_18, PDOVD1_18, and PDOVD2_18 maintains a low level.

In the second over-driver mode when the driving voltage is 1.8 V, the signal SUP_18, the signal NOM_18, and the signal OVD1_18 f a high level are applied.

Thus, the first and the third pull-down signals PDDU, PDNOM, and PDOVD1_18 and the fifth and the seventh pull-down signals PDDU_18, PDNOM_18, and PDOVD1 are shifted in response to the data signal PD18.

Furthermore, each of the fourth pull-down signal PDOVD2 and the eighth pull-down signal PDOD2_18 maintains a low level.

In the second over-driver mode when the driving voltage is 3.3 V, the signal NOM_33, the signal OVD1_33, and the signal OVD2_33 of a high level are applied.

Accordingly, the first to fourth pull-down signals PDDU, PDNOM, PDOVD1, and PDOVD2 are shifted in response to the data signals P and PN.

Furthermore, each of the fifth to eighth pull-down signals PDDU_18, PDNOM_18, PDOVD1_18, and PDOVD2_18 maintains a low level.

In the second over-driver mode when the driving voltage is 1.8 V, the signals SUP_18, SUP_18, NOM_18, OVD1_18, and OVD2_18 of a high level are applied.

Accordingly, the first to eighth pull-down signals PDUD, PDNOM, PDOVD1, PDOVD2, PDUD_18, PDNOM_18, PDOVD1_18, and PDOVD2_18 are shifted in response to the data signal PD18.

Figure 4D:
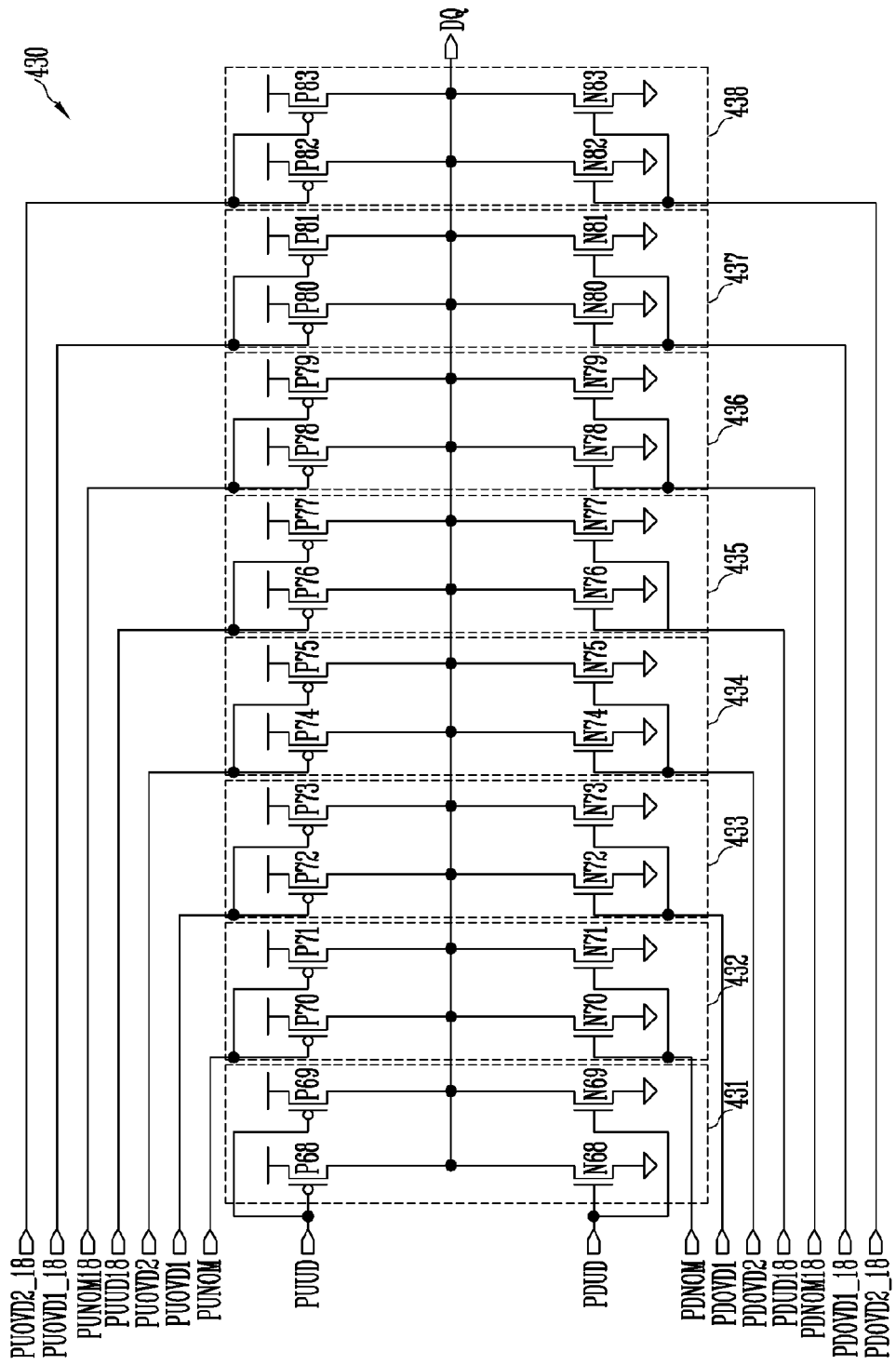
FIG. 4D is a detailed circuit diagram of an output driver of FIG. 4A.

A detailed circuit diagram of the output driver 430 for pulling up or down the data signals P and PN or the data signal P18 and transferring the result to the data line DQ in response to the first to eighth pull-up signals PUUD, PUNOM, PUOVD1, PUOVD2, PUUD_18, PUNOM_18, PUOVD1_18, and PUOVD2_18 and the first to eighth pull-down signals PDUD, PDNOM, PDOVD1, PDOVD2, PDUD_18, PDNOM_18, PDOVD1_18, and PDOVD2_18 which are outputted from the pull-up output pre-driver 410 and the pull-down output pre-driver 420 is shown in FIG. 4D.

FIG. 4D is the detailed circuit diagram of the output driver 430 of FIG. 4A.

Referring to FIG. 4D, the output driver 430 includes first to eighth output circuits 431 to 438.

The first to eighth output circuits 431 to 438 includes 68 to 83$^{rd}$ PMOS transistors P68 to P83 and 68$^{th}$ to 83$^{rd}$ NMOS transistors N68 to N83.

The 68$^{th}$ PMOS transistor P68 and the 68$^{th}$ NMOS transistor N68 are coupled in series between the power supply voltage and the ground node, and a node where the 68$^{th}$ PMOS transistor P68 and the 68$^{th}$ NMOS transistor N68 are connected is coupled to the data line DQ.

The 69$^{th}$ POMS transistor P69 and the 69$^{th}$ NMOS transistor N69 are coupled in series between the power supply voltage and the ground node, and a node where the 69$^{th}$ PMOS transistor P69 and the 69$^{th}$ NMOS transistor N69 are connected is coupled to the data line DQ.

Furthermore, the first pull-up signal PUUD is inputted to the gates of the 68$^{th}$ and the 69$^{th}$ PMOS transistors P68 and P69. Furthermore, the first pull-down signal PDUD is inputted to the gates of the 68$^{th}$ and the 69$^{th}$ NMOS transistors N68 and N69.

The 70$^{th}$ PMOS transistor P70 and the 70$^{th}$ NMOS transistor N70 are coupled in series between the power supply voltage and the ground node. A node where the 70$^{th}$ PMOS transistor P70 and the 70$^{th}$ NMOS transistor N70 are connected is coupled to the data line DQ.

The 71$^{st}$ PMOS transistor P71 and the 71$^{st}$ NMOS transistor N71 are coupled in series between the power supply voltage and the ground node. A node where the 71$^{st}$ PMOS transistor P71 and the 71$^{st}$ NMOS transistor N71 are connected is coupled to the data line DQ.

The second pull-up signal PUNOM is inputted to the 70$^{th}$ and the 71$^{st}$ PMOS transistors P70 and P71, and the second pull-down signal PDNOM is inputted to the gates of the 70$^{th}$ and the 71$^{st}$ NMOS transistors N70 and N71.

The 72$^{nd}$ PMOS transistor P72 and the 72$^{nd}$ NMOS transistor N72 are coupled in series between the power supply voltage and the ground node. A node where the 72$^{nd}$ PMOS transistor P72 and the 72$^{nd}$ NMOS transistor N72 are connected is coupled to the data line DQ.

The 73$^{rd}$ PMOS transistor P73 and the 73$^{rd}$ NMOS transistor N73 are coupled in series between the power supply voltage and the ground node. A node where the 73$^{rd}$ PMOS transistor P73 and the 73$^{rd}$ NMOS transistor N73 are connected is coupled to the data line DQ.

Furthermore, the third pull-up signal PUOVD1 is inputted to the gates of the 72$^{nd}$ and the 73$^{rd}$ PMOS transistors P72 and P73. The third pull-down signal PDOVD1 is inputted to the gates of the 72$^{nd}$ and the 73$^{rd}$ NMOS transistors N72 and N73.

The 74$^{th}$ PMOS transistor P74 and the 74$^{th}$ NMOS transistor N74 are coupled in series between the power supply voltage and the ground node. A node where the 74$^{th}$ PMOS transistor P74 and the 74th NMOS transistor N74 are connected is coupled to the data line DQ.

The 75th PMOS transistor P75 and the 75th NMOS transistor N75 are coupled in series between the power supply voltage and the ground node. A node where the 75th PMOS transistor P75 and the 75th NMOS transistor N75 are connected is coupled to the data line DQ.

The fourth pull-up signal PUOVD2 is inputted to the gates of the 74th and the 75th PMOS transistors P74 and P75. The fourth pull-down signal PDOVD2 is inputted to the gates of the 74th and the 75th NMOS transistors N74 and N75.

The 76th PMOS transistor P76 and the 76th NMOS transistor N76 are coupled in series between the power supply voltage and the ground node. A node where the 76th PMOS transistor P76 and the 76th NMOS transistor N76 are connected is coupled to the data line DQ.

The 77th PMOS transistor P77 and the 77th NMOS transistor N77 are coupled in series between the power supply voltage and the ground node. A node where the 77th PMOS transistor P77 and the 77th NMOS transistor N77 are connected is coupled to the data line DQ.

The fifth pull-up signal PUUD_18 is inputted to the gates of the 76th and the 77th PMOS transistors P76 and P77. The fifth pull-down signal PDUD_18 is inputted to the gates of the 76th and the 77th NMOS transistors N76 and N77.

The 78th PMOS transistor P78 and the 78th NMOS transistor N78 are coupled in series between the power supply voltage and the ground node. A node where the 78th PMOS transistor P78 and the 78th NMOS transistor N78 are connected is coupled to the data line DQ.

The 79th PMOS transistor P79 and the 79th NMOS transistor N79 are coupled in series between the power supply voltage and the ground node. A node where the 79th PMOS transistor P79 and the 79th NMOS transistor N79 are connected is coupled to the data line DQ.

The sixth pull-up signal PUNOM_18 is inputted to the gates of the 78th and the 79th PMOS transistors P78 and P79. The sixth pull-down signal PDNOM_18 is inputted to the gates of the 78th and the 79th NMOS transistors N78 and N79.

The 80th PMOS transistor P80 and the 80th NMOS transistor N80 are coupled in series between the power supply voltage and the ground node. A node where the 80th PMOS transistor P80 and the 80th NMOS transistor N80 are connected is coupled to the data line DQ.

The 81st PMOS transistor P81 and the 81st NMOS transistor N81 are coupled in series between the power supply voltage and the ground node. A node where the 81st PMOS transistor P81 and the 81st NMOS transistor N81 are connected is coupled to the data line DQ.

The seventh pull-up signal PUOVD1_18 is inputted to the gates of the 80th and the 81st PMOS transistors P80 and P81. The seventh pull-down signal PDOVD1_18 is inputted to the gates of the 80th and the 81st NMOS transistors N80 and N81.

The 82nd PMOS transistor P82 and the 82nd NMOS transistor N82 are coupled in series between the power supply voltage and the ground node. A node where the 82nd PMOS transistor P82 and the 82nd NMOS transistor N82 are connected is coupled to the data line DQ.

The 83rd PMOS transistor P83 and the 83rd NMOS transistor N83 are coupled in series between the power supply voltage and the ground node. A node where the 83rd PMOS transistor P83 and the 83rd NMOS transistor N83 are connected is coupled to the data line DQ.

The eighth pull-up signal PUOVD2_18 is inputted to the gates of the 82nd and the 83rd PMOS transistors P82 and P83. The eighth pull-down signal PDOVD2_18 is inputted to the gates of the 82nd and the 83rd NMOS transistors N82 and N83.

The first to eighth output circuits 431 to 438 of the output driver 430 are operated according to the driving voltages and the driver modes.

For example, in case of the under mode when the driving voltage is 3.3 V, the pull-up output pre-driver 410 may output the first pull-up signal PUUD and the pull-down output pre-driver 420 may output the first pull-down signal PDUD in response to the data signals P and PN.

The 70th to 83rd PMOS transistors P70 to P83 of the second to eighth output circuits 432 to 438 are turned off because each of the second to eighth pull-up signals PUNOM, PUOVD1, PUOVD2, PUUD_18, PUNOM_18, PUOVD1_18, and PUOVD2_18 is a high level.

Furthermore, the 70th to 83rd NMOS transistors N70 to N83 of the second to eighth output circuits 432 to 438 are turned off because each of the second to eighth pull-down signals PDNOM, PDOVD1, PDOVD2, PDUD_18, PDNOM_18, PDOVD1_18, and PDOVD2 is a low level.

In another example, in case of the nominal mode when the driving voltage is 1.8 V, the first and the second pull-up signals PUUD and PUNOM and the fifth and the sixth pull-up signals PUUD_18 and PUNOM_18 are outputted in response to the data signal P18. Furthermore, each of the third and the fourth pull-up signals PUOVD1 and PUOVD2 and the seventh and the eighth pull-up signals PUOVD1_18 and PUOVD2_18 is a low level.

Furthermore, the first and the second pull-down signals PDUD and PDNOM and the fifth and the sixth pull-down signals PDUD_18 and PDNOM_18 are outputted in response to the data signal P18. Furthermore, each of the third and the fourth pull-down signals PDOVD1 and PDOVD2 and the seventh and the eighth pull-down signals PDOVD1_18 and PDOVD2_18 is a low level.

Accordingly, the first and the second output circuits 431 and 432 and the fifth and the sixth output circuits 435 and 436 are operated, but the third and the fourth output circuits 433 and 434 and the seventh and the eighth output circuits 437 and 438 are not operated.

The number of output circuits which are operated in the output driver 430 is controlled according to a driving voltage and a driver mode.

Figure 5:
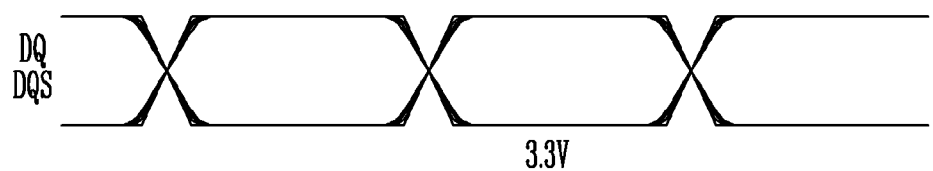
FIG. 5 shows data outputted from the data output driver circuit of FIG. 4B.
Figure 5:
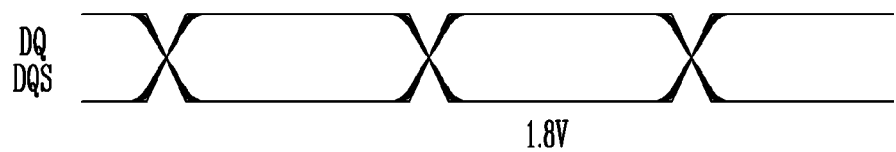

FIG. 5 shows an example of data outputted from the data output driver circuit 330 of FIG. 4B.

From FIG. 5, it can be seen that, although a driving voltage and a driver mode are changed, a tilt that data outputted from the data line DQ may be maintained.

The data output driver and an IC including the same according to the exemplary embodiment of this disclosure can output data controlling the slew rate and the driver strength according to the operating voltage and the number of memory chips which are allocated to the data output driver.

What is claimed is:
1. A data output driver, comprising:
a pull-up output pre-driver configured to output a plurality of pull-up signals, wherein whether each of the plurality of pull-up signals is enabled is determined in accordance with a driver mode signal, wherein the driver mode signal is determined in accordance with a driving voltage of a memory chip which is allocated to the data output driver;
a pull-down output pre-driver configured to output a plurality of pull-down signals, wherein whether each of the plurality of pull-down signals is enabled is determined in accordance with the driver mode signal; and an output driver circuit configured to output data, wherein a driver strength of the output driver circuit is determined in accordance with the pull-up signals and pull-down signals, wherein the driver mode signal comprises first to fourth driver mode signals for selecting first to fourth driver modes as to a number of memory chips which are allocated to the data output driver for the first driving voltage and fifth to eighth driver mode signals for selecting the first to fourth driver modes as to the number of memory chips which are allocated to the data output driver for the second driving voltage.

2. The data output driver of claim 1, wherein the driver mode signal is determined in accordance with a number of memory chips which are allocated to the output driver.

3. The data output driver of claim 1, wherein the pull-up output pre-driver comprises a plurality of pull-up circuits, and wherein the pull-down output pre-driver comprises a plurality of pull-down circuits.

4. The data output driver of claim 3, wherein at least one of the plurality of pull-up circuits is selectively operated in response to the driver mode signal.

5. The data output driver of claim 3, wherein at least one of the plurality of pull-down circuits is selectively operated in response to the driver mode signal.

6. The data output driver of claim 1, wherein the driving voltage comprises a first driving voltage and a second driving voltage lower than the first driving voltage.

7. The data output driver of claim 1, wherein in the first to eighth driver mode signals, in the first driver mode, the first or fifth driver mode signals are enabled in accordance with the driving voltage, in the second driver mode, the first and the second driver mode signals or the fifth and the sixth driver mode signals are enabled in accordance with the driving voltage, in the third driver mode, the first to third driver mode signals or the fifth to seventh driver mode signal are enabled in accordance with the driving voltage, and in the fourth driver mode, the first to fourth driver mode signals or the fifth to eighth driver mode signals are enabled in accordance with the driving voltage.

8. The data output driver of claim 7, wherein the pull-up output pre-driver comprises:
a first pull-up circuit configured to output a first pull-up driver signal in the first to the fourth driver modes;
a second pull-up circuit configured to output a second pull-up driver signal in the second to fourth driver modes;
a third pull-up circuit configured to output a third pull-up driver signal in the third and fourth driver modes;
a fourth pull-up circuit configured to output a fourth pull-up driver signal in the fourth driver mode;
a fifth pull-up circuit comprising a first circuit configured to output a fifth pull-up driver signal in the first to fourth driver modes for the second driving voltage and a second circuit configured to output a sixth pull-up driver signal in the second to fourth driver modes for the second driving voltage; and
a sixth pull-up circuit comprising a third circuit configured to output a seventh pull-up driver signal in the third and fourth driver modes for the second driving voltage and a fourth circuit configured to output an eighth pull-up driver signal in the fourth driver mode for the second driving voltage.

9. The data output driver of claim 8, wherein the pull-down output pre-driver comprises:
a first pull-down circuit configured to output a first pull-down driver signal in the first to the fourth driver modes;
a second pull-down circuit configured to output a second pull-down driver signal in the second to fourth driver modes;
a third pull-down circuit configured to output a third pull-down driver signal in the third and fourth driver modes;
a fourth pull-down circuit configured to output a fourth pull-down driver signal in the fourth driver mode;
a fifth pull-down circuit comprising a fifth circuit configured to output a fifth pull-down driver signal in the first to fourth driver modes for the second driving voltage and a sixth circuit configured to output a sixth pull-down driver signal in the second to fourth driver modes for the second driving voltage; and
a sixth pull-down circuit comprising a seventh circuit configured to output a seventh pull-down driver signal in the third and fourth driver modes for the second driving voltage and an eighth circuit configured to output an eighth pull-down driver signal in the fourth driver mode for the second driving voltage.

10. The data output driver of claim 9, wherein the output driver circuit comprises:
a pull-up unit for pulling up a data output terminal in response to the first to eighth pull-up driver signals; and
a pull-down unit for pulling down a data output terminal in response to the first to eighth pull-down driver signals.

11. The data output driver of claim 10, wherein the pull-up unit comprises first to eighth PMOS transistors coupled between a power supply voltage and the data output terminal, wherein the first to eighth PMOS transistors are configured to be turned on in response to the first to eighth pull-up driver signals, respectively.

12. The data output driver of claim 10, wherein the pull-down unit comprises first to eighth NMOS transistors coupled between the data output terminal and a ground node, wherein the first to eighth NMOS transistors are configured to be turned on in response to the first to eighth pull-down driver signals, respectively.

13. The data output driver of claim 10, wherein the driver strength of the output driver circuit is increased from the first driver mode to the fourth driver mode.

14. An integrated circuit, comprising:
an internal circuit configured to output a driver mode signal;
a pull-up output pre-driver configured to output a plurality of pull-up signals, wherein whether each of the plurality of pull-up signals is enabled is determined in accordance with a driver mode signal which is determined in accordance with a driving voltage of a memory chip which is allocated to the integrated circuit;
a pull-down output pre-driver configured to output a plurality of pull-down signals, wherein whether each of the plurality of pull-down signals is enabled is determined in accordance with the driver mode signal; and
an output driver circuit configured to output data, wherein a driver strength of the output driver circuit is determined in accordance with the pull-up signals and pull-down signals,
wherein the driver mode signal comprises first to fourth driver mode signals for selecting first to fourth driver modes as to a number of memory chips which are allocated to the integrated circuit for the first driving voltage and fifth to eighth driver mode signals for selecting the first to fourth driver modes as to the number of memory chips which are allocated to the integrated circuit for the second driving voltage.

15. The integrated circuit of claim 14, wherein the driver mode signal is determined in accordance with a driving voltage of a memory chip which is allocated to the integrated circuit.

16. The integrated circuit of claim 14, wherein the driver mode signal is determined in accordance with a number of memory chips which are allocated to the output driver.

17. The integrated circuit of claim 14, wherein the pull-up output pre-driver comprises a plurality of pull-up circuits, and wherein the pull-down output pre-driver comprises a plurality of pull-down circuits.

18. The integrated circuit of claim 17, wherein at least one of the plurality of pull-up circuits is selectively operated in response to the driver mode signal, and wherein at least one of the plurality of pull-down circuits is selectively operated in response to the driver mode signal.

\* \* \* \* \*